(12) United States Patent
Niemi et al.

(10) Patent No.: US 9,584,113 B2
(45) Date of Patent: Feb. 28, 2017

(54) ARRANGEMENT AND METHOD FOR A POWER SEMICONDUCTOR SWITCH

(71) Applicant: ABB Technology Oy, Helsinki (FI)

(72) Inventors: Mika Niemi, Helsinki (FI); Lauri Peltonen, Klaukkala (FI)

(73) Assignee: ABB Technology Oy, Helsinki (FI)

( * ) Notice: Subject to any disclaimer, the term of this patent is extended or adjusted under 35 U.S.C. 154(b) by 100 days.

(21) Appl. No.: 14/705,280

(22) Filed: May 6, 2015

(65) Prior Publication Data

US 2015/0326222 A1 Nov. 12, 2015

(30) Foreign Application Priority Data

May 9, 2014 (EP) .................................... 14167681

(51) Int. Cl.
*H03K 3/00* (2006.01)
*H03K 17/687* (2006.01)
(Continued)

(52) U.S. Cl.
CPC ......... *H03K 17/687* (2013.01); *H03K 17/102* (2013.01); *H03K 17/127* (2013.01);
(Continued)

(58) Field of Classification Search
None
See application file for complete search history.

(56) References Cited

U.S. PATENT DOCUMENTS 5,808,504 A * 9/1998 Chikai ............... H03K 17/0406
327/380
5,926,012 A * 7/1999 Takizawa ........... H03K 17/0828
323/284
(Continued)

FOREIGN PATENT DOCUMENTS

EP 1 770 863 A1 4/2007
EP 2 546 985 A2 1/2013
(Continued)

OTHER PUBLICATIONS

Search Report dated Jul. 21, 2014, by the European Patent Office for Application No. 1416768.1.

*Primary Examiner* — Tuan T Lam
(74) *Attorney, Agent, or Firm* — Taft Stettinius & Hollister LLP

(57) ABSTRACT

An exemplary arrangement and method for a power semiconductor switch, where a first current between a first electrode and a second electrode can be controlled based on a control voltage between a third electrode and the first electrode. The arrangement includes an inductance connected in series with the power semiconductor switch, wherein a first end of the inductance is connected to the first electrode, first measuring source for generating a first measurement voltage based on the first end's voltage with respect to a reference potential, second measuring source for generating a second measurement voltage on the basis of the inductance's second end voltage with respect to the reference potential, a comparator for comparing the first measurement voltage with the second measurement voltage, and driver for generating the control voltage. The driver being configured to generate a first control voltage level and a second voltage level of the control voltage.

14 Claims, 2 Drawing Sheets

(51) Int. Cl.
*H03K 17/10* (2006.01)
*H03K 17/567* (2006.01)
*H03K 17/12* (2006.01)
*H03K 17/18* (2006.01)
*H03K 17/689* (2006.01)
*H03K 17/64* (2006.01)

(52) U.S. Cl.
CPC ........... *H03K 17/18* (2013.01); *H03K 17/567* (2013.01); *H03K 17/64* (2013.01); *H03K 17/689* (2013.01); *H03K 2217/0027* (2013.01)

(56) References Cited

U.S. PATENT DOCUMENTS

| | | | | |
|---|---|---|---|---|
| 6,330,143 | B1* | 12/2001 | Maly | H03K 17/0828 361/101 |
| 2002/0191424 | A1* | 12/2002 | Heinke | F02D 41/20 363/41 |
| 2005/0253165 | A1 | 11/2005 | Pace et al. | |
| 2007/0064368 | A1 | 3/2007 | Ohshima | |
| 2007/0200602 | A1 | 8/2007 | Ishikawa et al. | |
| 2007/0228769 | A1 | 10/2007 | Dandekar et al. | |
| 2008/0007318 | A1 | 1/2008 | Pace et al. | |
| 2008/0252277 | A1* | 10/2008 | Sase | H02M 3/157 323/283 |
| 2009/0190377 | A1* | 7/2009 | Wang | H02M 3/156 363/21.1 |
| 2010/0060326 | A1 | 3/2010 | Palmer et al. | |
| 2013/0015889 | A1 | 1/2013 | Kesler | |
| 2015/0061611 | A1* | 3/2015 | Li | H02M 3/1588 323/235 |
| 2015/0340355 | A1* | 11/2015 | Zhang | G01R 19/00 361/86 |

FOREIGN PATENT DOCUMENTS

| | | |
|---|---|---|
| WO | WO 2006/015884 A1 | 2/2006 |
| WO | WO 2008/032113 A1 | 3/2008 |

* cited by examiner

ARRANGEMENT AND METHOD FOR A POWER SEMICONDUCTOR SWITCH

RELATED APPLICATION(S)

This application claims priority under 35 U.S.C. §119 to European application 1416781.7 filed on May 9, 2014, the content of which is hereby incorporated by reference in its entirety.

FIELD

The present disclosure relates to control of power semiconductor switches, and particularly to monitoring switching events of power semiconductor switches.

BACKGROUND INFORMATION

Controlling the gate of power semiconductor switches, such as insulated gate bipolar transistors (IGBTs) and metal oxide semiconductor field effect transistors (MOSFETs), is an important element of an inverter or a frequency converter. A power semiconductor switch in an inverter or a frequency converter is often configured to be controlled to one of two operational states: a conductive state (e.g., an on-state) or a non-conductive state (e.g., off-state).

Many aspects may have to be taken into account in the design of a driver circuit controlling the operational state of a power semiconductor switch. Operating voltage potential of a power semiconductor switch may radically change during operation, and the power semiconductor may operate at different voltage potential from the voltage potential the controller controlling the whole system. Therefore, a driver unit controlling the power semiconductor switch may be galvanically isolated from the controller.

The controller and the driver unit may be isolated from each other by an optical isolator, for example. An isolating power supply may be used for generating a positive voltage or a positive voltage and a negative voltage in order to be able to drive the semiconductor switch to a desired operational state.

For example, the semiconductor switch may be driven to the conductive state by supplying the positive control voltage to a control terminal, e.g. the gate terminal, of the semiconductor switch. The negative voltage may be used for producing a sufficiently high gate current during turn-off events and for ensuring that the semiconductor switch remains in the off-state even if voltage spikes appear in the gate voltage. In IGBTs, the supplied voltage/voltages is/are tied to a voltage potential of an emitter- or auxiliary emitter of the IGBT.

In order to achieve higher power ratings, parallel-connected power semiconductor switches may be used in inverters and frequency converters. However, because of physical differences between the parallel-connected switches and/or between the components implementing the driver circuitries controlling the switches, the switches may not turn on (or off) simultaneously. These non-concurrent switching events may cause additional losses.

Thus, it may be desirable to adjust the instants of turn-on and turn-off switching events of individual switches in order to achieve concurrent switching events. Various types of feedback implementations may be used for determining the instants of the actual switching event. For example, if the power semiconductor switch, e.g. an IGBT, is provided with a main emitter terminal and auxiliary emitter terminal, a voltage across a bonding wire between these terminals may be used for estimating the rate of change of emitter current. The rate of change may then be used for detecting a turn-on or turn-off event.

However, since the rates of change to be detected may be very fast, the measurement circuitry for detecting rates of change may have to be built from very high speed components. Further, in order to obtain measurement results from different switches in a manner that the results are accurately comparable, propagation delay skew of the detection circuitry may also have to be very low, in the order of magnitude of nanoseconds. An implementation able to meet these specifications may call for costly components and/or manufacturing processes, which may reduce cost-effectiveness of the implementation.

Further, the number of isolation channels for the control and/or feedback signal may have a significant effect on the cost-effectiveness of the system, for example, if modern high-temperature-rated CMOS digital isolators are being used. The availability of components may also have to be considered.

A three-phase frequency converter with a DC intermediate circuit can specify at least six power semiconductors for the output. Therefore, any increase or decrease in cost-effectiveness of a driver unit may have a six-fold effect on the frequency converter.

SUMMARY

An arrangement is disclosed for a power semiconductor switch in which a first current between a first electrode and a second electrode is configured to be controlled on the basis of a control voltage between a third electrode and the first electrode, the arrangement comprising: an inductance connected in series with the power semiconductor switch, wherein a first end of the inductance is connected to the first electrode; first measuring means for generating a first measurement voltage on the basis of a voltage of the first end of the inductance with respect to a reference potential, wherein the first measuring means has a first gain and a first offset; second measuring means for generating a second measurement voltage on the basis of a voltage of a second end of the inductance with respect to the reference potential, wherein the second measuring means has a second gain that differs from the first gain and a second offset that differs from the first offset; a comparator for comparing the first measurement voltage with the second measurement voltage; and driver means for generating the control voltage, the driver means being configured to generate a first control voltage level and a second voltage level of the control voltage, wherein the driver means are coupled to the reference potential in such a manner that, during use, the first and second voltage levels generate different first electrode voltages with respect to the reference potential.

A method for a power semiconductor switch in which a first current between a first electrode and a second electrode is controlled on the basis of a control voltage between a third electrode and the first electrode, the power semiconductor being connected in series with an inductance, and a first end of the inductance being connected to the first electrode, the method comprising: controlling the power semiconductor switch by generating a first control voltage level and a second voltage level of the control voltage in a manner that the first and second voltage levels generate different first electrode voltages with respect to a reference potential; generating a first measurement voltage on the basis of a first end voltage of the inductance with respect to the reference potential by using measuring means having a first gain and a first offset; generating a second measurement voltage on the basis of a second voltage of the inductance with respect to the reference potential by using measuring means having second gain that differs from the first gain and a second offset that differs from the first offset; comparing the first measurement voltage with the second measurement voltage; and generating a feedback signal on the basis of the comparison.

BRIEF DESCRIPTION OF THE DRAWINGS

In the following the disclosure will be described in greater detail by means of preferred embodiments with reference to the attached drawings, in which.

DETAILED DESCRIPTION

Figure 1:
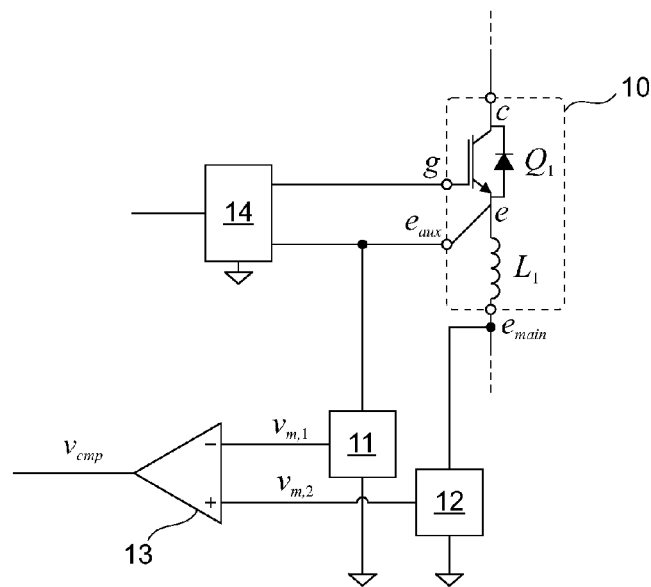
FIG. 1 shows a simplified block diagram of an arrangement according to an exemplary embodiment of the present disclosure.

According to exemplary embodiments of the present disclosure, a rate of change of a current, such as the emitter current, of a power semiconductor switch, can be monitored by monitoring a voltage over an inductance in series with the switch. A voltage difference between the two ends of the inductance represents the rate of change of the current through the inductance, and thus, also through the power semiconductor switch. On the basis of the voltage difference, instants of the rate of change exceeding a set threshold level for rate of change can be detected.

In an exemplary arrangement and method according to the present disclosure, voltages at both ends of the inductance may be measured. Measurement circuitry for measuring the voltage difference may be configured such that when the current through the inductance is not changing (e.g., rate of change is zero), measurements of the voltages at both ends of the inductance still show a voltage difference between them. This difference can be considered to represent the threshold for the rate of change.

As the rate of change starts to increase, the difference decreases, and eventually, the measurement values cross each other. Thus, in order to detect rates of change exceeding the threshold level, measurements of the voltages at the two ends of the inductance may be compared with each other. When the rate of change exceeds the set threshold, the two measurement values cross each other, the comparator changes its state, and exceeding the threshold can be indicated.

However, during turn-on and turn-off events of the switch, the rate of change can have different polarities. In order to monitor rates of change both during turn-on event and during turn-off event, the measurement circuitry may be coupled to a driver unit driving the control terminal of the power semiconductor switch. The measurement circuitry may be coupled to the driver unit so that a change in the level of the control voltage changes the voltage potential of the inductor. Gains and offsets of the measurements of the voltages of the inductor ends may be configured such that the new level of the control voltage causes a new voltage difference with an opposite sign between the measurements. The new voltage difference causes the comparator to change its state.

The new voltage difference represents the threshold for the negative rate of change. As the negative rate of change starts to increase, the difference decreases, and, eventually, the measurement values cross each other. Again, the comparator changes its state. Thus, rates of change of current during turn-on events and turn-off events may be monitored by using one comparator. Since only one comparator is specified, the monitoring rates of change during the turn-on and turn-off events may be implemented using just one signal line.

Further, since the comparator changes its state also when the level of the control signal changes, e.g. in order to turn the switch on or off, the one signal line may also be used for indicating when the control terminal, e.g. gate, receives a turn-on or turn-off signal. Accordingly, only one isolation component may be specified for the signal line.

An exemplary embodiment according to the present disclosure may be used with parallel- or series-connected power semiconductor switches, for example. Moreover, instants of switching events of the power semiconductor switches may be detected and adjusted with minimal additional cost on gate control circuitry.

An exemplary embodiment according to the present disclosure may lead to significant reductions in the component count, circuit board area, and cost.

Further, since a change in the level of the control voltage (e.g. in order to turn-on and turn-off the switch) can be detected, a round trip delay of the driver unit control chain may also be measured and a delay variation of the isolation component may be minimized.

Also, when the indications of turn-on events and rates of change use a same comparator and feedback isolator channel, they are delayed by a same amount of time. Time difference from gate turn and rate-of-change pulse may be evaluated, and the effect of delay skew of comparator and isolator components may be minimized.

Exemplary embodiments of the present disclosure describe an arrangement (and a method) for monitoring switching events of a power semiconductor switch. In the power semiconductor switch, a first current between a first electrode and a second electrode may be configured to be controlled on the basis of a control voltage between a third electrode and the first electrode. For example, in case of an IGBT as a power semiconductor switch, the first electrode may be the emitter, the second electrode may be the collector, the third electrode may be the gate, and the first current may be the emitter current, for example. The control voltage may be a gate-emitter voltage.

Embodiments of the arrangement and the method according to the present disclosure are not limited to applications with IGBTs. They are also applicable to other types of voltage-controlled semiconductor switches, such as power MOSFETs. Further, in addition to detection of switching events of a single power semiconductor switch, an arrangement and method according to the present disclosure may be used with parallel- or series-connected power semiconductor switches.

A rate of change of a current, such as the emitter current, of the power semiconductor switch, can be monitored by monitoring a voltage over an inductance in series with the power semiconductor switch. A voltage difference between the two ends of the inductance represents the rate of change of the current through the inductance and the power semiconductor switch. Thus, an arrangement according to the present disclosure may include an inductance connected in series with the power semiconductor switch where a first end of the inductance is connected to the first electrode.

FIG. 1 shows a simplified block diagram of an arrangement according to an exemplary embodiment of the present disclosure. As shown in FIG. 1, a power semiconductor switch in the form of an IGBT $Q_1$ is within an IGBT module 10. A current between an emitter e acting as the first electrode and a collector c acting as the second electrode is controlled on the basis of a control voltage $v_{ge}$ between a gate g acting as the third electrode and the emitter e. The emitter e may include (e.g., comprise) a main terminal $e_{main}$ and an auxiliary terminal $e_{aux}$. The control voltage $v_{ge}$ may be supplied between the third electrode g and the auxiliary terminal of the first electrode e.

In the module 10, an inductance $L_1$ may be connected in series with the IGBT $Q_1$. The inductance may be formed by a bonding wire in the module 10, for example. The voltage over the inductance may be measured between an auxiliary emitter terminal $e_{aux}$ and a main emitter terminal $e_{main}$ of the module 10.

In an exemplary arrangement or an exemplary method as described in the present disclosure, the power semiconductor switch may be controlled by generating a first control voltage level and a second control voltage level of the control voltage. The levels of the control voltage may be such that the first control voltage level sets the power semiconductor switch to a non-conductive state, and the second control voltage level sets the power semiconductor switch to a conductive state. The first and second voltage levels generate different first electrode voltages with respect to a reference potential. In FIG. 1, a local ground potential is shown as a triangular ground symbol acts as the reference potential.

An exemplary arrangement according to the present disclosure may include driver means (e.g., voltage generation circuit) generating the control voltage. The driver means may be configured to generate the first control voltage level and the second voltage level of the control voltage. Driver means generating the control voltage may be coupled to the reference potential, for example. In FIG. 1, driver means 14 generate the control voltage $v_{ge}$. The driver means 14 are tied to the local ground potential.

In order to determine the rate of change, a first measurement voltage may be generated on the basis of a voltage at the first end of the inductance, and a second measurement voltage may be generated on the basis of a voltage at the second end of the inductance.

For example, according to another exemplary arrangement described in the present disclosure, the arrangement can include first measuring means for generating a first measurement voltage in response to a voltage at the first end, and second measuring means for generating a second measurement voltage in response a voltage at a second end of the inductance, respectively. The first measuring means may have a first gain and a first offset while the second measuring means have a second gain that differs from the first gain and a second offset that differs from the first offset. The first measurement voltage may be generated on the basis the first end's voltage with respect to the reference potential. The second measurement voltage is generated on the basis of the second end's voltage with respect to the same reference potential.

In FIG. 1, first measuring means 11 generate a first measurement voltage $v_{m,1}$ on the basis of the voltage at a first end of the inductance $L_1$. Second measuring means 12 generate a second measurement voltage $v_{m,2}$ on the basis of the voltage at a second end of the inductance $L_1$. The first measuring means 11 has a first gain and a first offset voltage, and the second measuring means 12 has a second gain and a second offset voltage. The reference potential for the voltages at the first and the second end of the inductance $L_1$ is the local ground potential in FIG. 1.

In order to determine if the rate of change exceeds a set limit in an exemplary arrangement or an exemplary method according to the present disclosure, the first measurement voltage may be compared with the second measurement voltage, and a feedback signal can be generated on the basis of the comparison. For example, a comparator may be used for comparing the first measurement voltage with the second measurement voltage. With low or zero rate of change, the comparator output $v_{cmp}$ remains in one state. When the rate of change exceeds the set limit, the voltage difference changes polarity, and the comparator output $v_{cmp}$ changes its state. The comparator remains in this new state as long as the rate of change remains above the set limit. Therefore, the instant when the rate of change again falls below the set limit (e.g. to an allowable level) can also be detected. In FIG. 1, a comparator 13 compares the first measurement $v_{m,1}$ with the second measurement $v_{m,2}$.

In order to be able to monitor rates of change both during turn-on event and during turn-off event, the measurement circuitry in an arrangement according to the present disclosure may be coupled to driver means driving the control terminal of the power semiconductor switch. The driver means may also be coupled to the reference potential in such a manner that, during use, the first and second voltage levels generate different first electrode voltages with respect to the reference potential. When the level of the control voltage is changed during a switching event of the power semiconductor switch, for example, the change in the level of the control voltage induces changes in the voltage potentials of the inductor's two ends.

In FIG. 1, the first measuring means 11 generate the first measurement voltage $v_{m,1}$ on the basis of a voltage between the auxiliary emitter terminal $e_{aux}$ acting as the first electrode and the local ground potential acting as the reference potential. The driver means 14 are tied to the local ground potential, and configured such that the first and second voltage levels generate different first electrode voltages with respect to the local ground potential. The driver means 14 may be implemented as an H-bridge, for example. However, implementations of the driver means in an arrangement or a method according to the present disclosure are not limited to H-bridges.

Figure 2A:
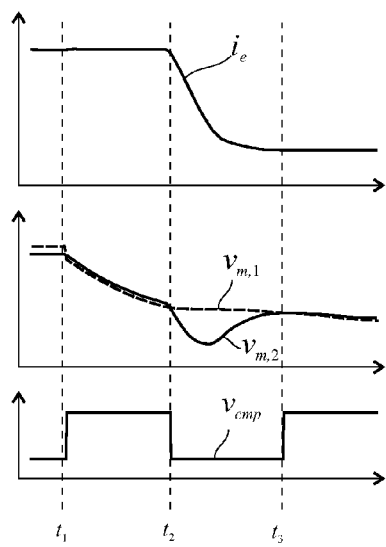
FIGS. 2a and 2b show exemplary waveforms of an arrangement according to an exemplary embodiment of the present disclosure.
Figure 2B:
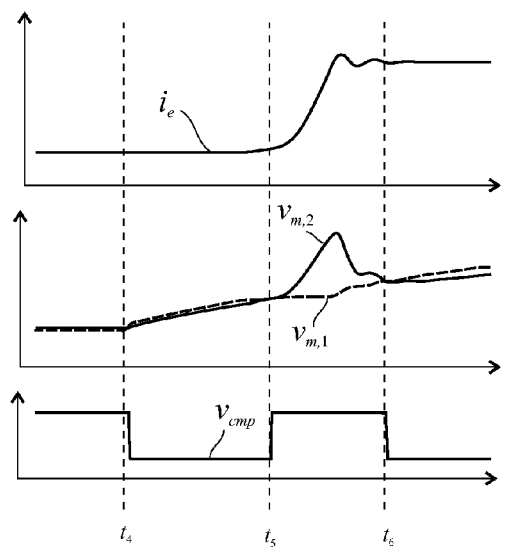

FIGS. 2a and 2b show exemplary waveforms of an arrangement according to an exemplary embodiment of the present disclosure. Operation of an arrangement and a method according to the present disclosure is discussed in relation to FIGS. 2a and 2b. FIG. 2a shows a turn-on switching event and FIG. 2b shows a turn-off event.

The top graphs of FIGS. 2a and 2b show the first current represented as an emitter current $i_e$. The emitter current $i_e$ increases downward in FIGS. 2a and 2b. The middle graphs of FIGS. 2a and 2b show a first measurement voltage $v_{m,1}$ (dashed line) measured with first measurement means according to the present disclosure and a second measurement voltage $v_{m,2}$ (solid line) measured with second measurement means according to the present disclosure. The bottom graph shows the comparator output $v_{cmp}$.

In an arrangement and method according to the present disclosure, the first gain, the second gain, the first offset, and the second offset may be selected such that, in operation, the comparator changes its state when the level of the control voltage changes, e.g. in order to turn the switch on or off.

There is a delay between the change in the level of the control signal and the power semiconductor actually turning on or off. Thus, at the instant of the control signal change, the emitter current $i_e$ does not yet change and the voltage over the inductance may remain at zero. Thus, the first control voltage level induces a first voltage difference level between first measurement voltage and the second measurement voltage that sets the comparator to a first state. Similarly, the second control voltage level induces a second voltage difference level between first voltage and the second voltage that sets the comparator to a second state.

At instant $t_1$ in FIG. 2a, the control voltage controlling a power semiconductor switch changes from a first control voltage level to a second control voltage level in response to a turn-on command. As a result, the voltage difference between the first measurement voltage $v_{m,1}$ and the second measurement voltage $v_{m,2}$ changes to a new level having the opposite polarity. In response to that, the comparator output $v_{cmp}$ changes its state. Similarly in FIG. 2b, a change of level of the control voltage at instant $t_4$, causes the difference between the first measurement voltage $v_{m,1}$ and the second measurement voltage $v_{m,2}$ to change its polarity, and the comparator to change its state.

The first gain, the second gain, the first offset, and the second offset may also be selected in an arrangement and method according to an exemplary embodiment the present disclosure such that, in operation, a change in the rate of change of the emitter current $i_e$ flowing through the inductance induces a change in a voltage difference between the first measurement voltage and the second measurement voltage. The first gain, the second gain, the first offset, and the second offset may be selected such that as the magnitude of the rate of change increases, the voltage difference decreases. When the magnitude of the rate of change reaches a set threshold, the voltage difference reduces to zero. If the magnitude of the rate of change exceeds the threshold, the voltage difference changes polarity (e.g., sign). For example, the first gain, the second gain, the first offset, and the second offset may be selected such that, in operation, if the rate of change increases above a first limit during a turn-on event, the voltage difference changes its sign and the comparator changes its state. The gains and offsets may be such that, if the rate of change decreases below a second limit during a turn-off event, the voltage difference again changes its sign and the comparator changes its state. The second gain may be lower than the first gain and the second offset may be higher than the first offset, for example.

Just before instant $t_2$ in FIG. 2a, the emitter current $i_e$ starts to rise. A voltage over an inductance in series with the power semiconductor switch appears, thereby indicating a non-zero rate of change of the emitter current $i_e$. As a result, the voltage difference between the first measurement voltage $v_{m,1}$ and the second measurement voltage $v_{m,2}$ decreases to zero at instant $t_2$. The comparator output $v_{cmp}$ changes its state as an indicator of the rate of change exceeding the set limit.

Just before instant $t_3$, the emitter current $i_e$ starts to settle to its conductive state level, and the magnitude of the rate of change of the emitter current $i_e$ starts to decrease. At instant $t_3$, the magnitude of the rate of change falls below the set limit, the voltage difference between the first measurement voltage $v_{m,1}$ and the second measurement voltage $v_{m,2}$, changes its polarity again, and the comparator output $v_{cmp}$ changes its state.

During a turn-off event, as shown in FIG. 2b, the exemplary arrangement operates in the same manner as during turn-on. Just before instant $t_5$, the emitter current $i_e$ starts to fall, and a (negative) rate of change increases. The voltage difference between the first measurement voltage $v_{m,1}$ and the second measurement voltage $v_{m,2}$ decreases to zero at instant $t_5$, and the comparator changes its state. At instant $t_6$, the magnitude of the rate of change falls again below the set limit, the voltage difference between the first measurement voltage $v_{m,1}$ and the second measurement voltage $v_{m,2}$, changes its polarity, and the comparator output $v_{cmp}$ changes its state.

Since a single comparator may be used for monitoring rate of change of the first current during both turn-on events and turn-off events, indicators on rates of change during the turn-on and turn-off events may be implemented by using just one signal line. Accordingly, only one isolation component may be specified for the signal line.

Because instants of control terminal turn-on and turn-off events can be detected, a round trip delay of the driver unit control chain may be measured and a delay variation of the isolation component may be minimized.

When the indications on turn-on events and rate of change use one comparator and feedback isolator channel, they are delayed by a same amount of time. Thus, the effect of delay skew of comparator and isolator components may be minimized by evaluating the time difference from gate turn and rate-of-change pulse.

Figure 3:
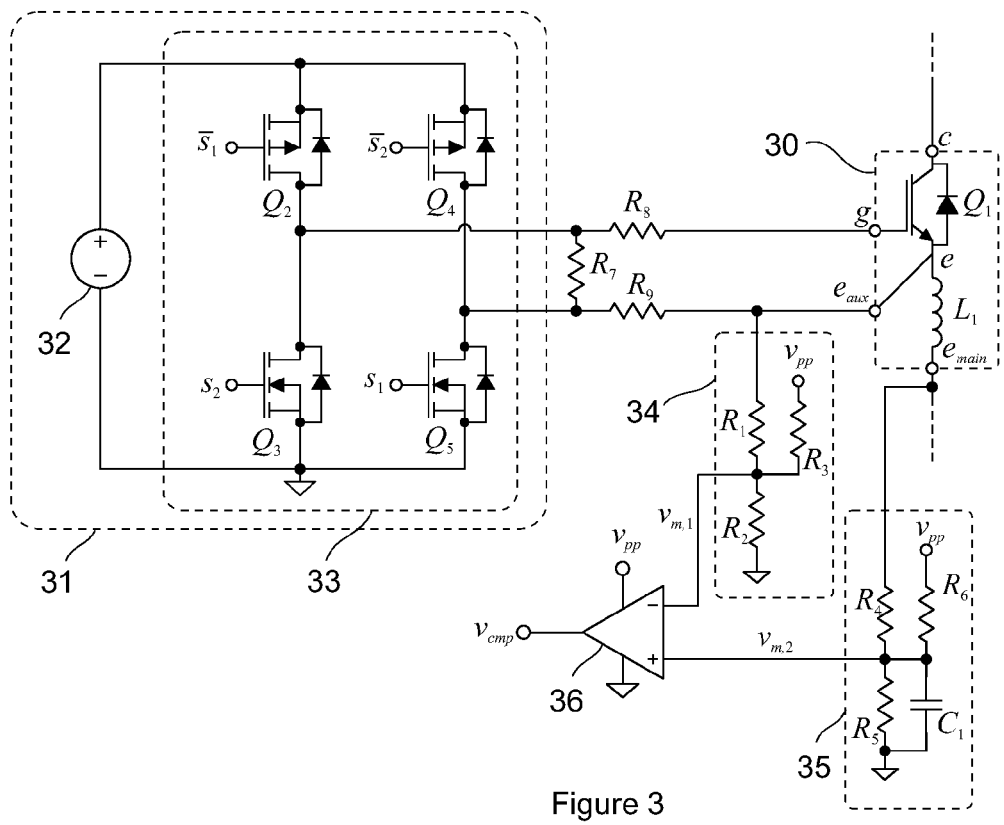
FIG. 3 shows an implementation according to an exemplary embodiment of the present disclosure.

FIG. 3 shows an implementation according to an exemplary embodiment of the present disclosure. In FIG. 3, an IGBT $Q_1$ is connected in series with an inductance $L_1$ in an IGBT module 30. An emitter (acting as the first electrode) of the IGBT $Q_1$ comprises a main terminal $e_{main}$ and an auxiliary terminal $e_{aux}$. The inductance $L_1$ is formed by a bonding wire that connects the auxiliary terminal $e_{aux}$ to the main terminal $e_{main}$.

An emitter current (acting as the first current) between the main emitter terminal $e_{main}$ and a collector c (acting as the second electrode) of the IGBT $Q_1$ is controlled on the basis of a gate-emitter voltage $v_{ge}$ (acting as the control voltage) between a gate g (acting as the third electrode) of the IGBT $Q_1$ and the auxiliary emitter terminal $e_{aux}$.

In FIG. 3, the driver means 31 for generating the gate-emitter voltage $v_{ge}$ are formed by a power supply 32 for supplying the gate-emitter voltage $v_{ge}$ between the gate g and the emitter e, and switching means 33 for inverting the polarity of the supplied gate-emitter voltage $v_{ge}$. In this manner, a non-zero, negative or positive gate-emitter voltage $v_{ge}$ can always be produced even when only one supply voltage is being used. Resistors $R_7$ to $R_9$ act as gate resistors.

The power supply 32 may be a positive voltage supply that supplies +15 V of voltage, for example. The driver means 31 in FIG. 3 may thus generate a gate-emitter voltage $v_{ge}$ that is either −15 V or 15 V.

The switching means 33 are in the form of an H-bridge in FIG. 3. The H-bridge 33 includes two branches. A first branch includes a series connection of two semiconductor switches $Q_2$ and $Q_3$ between the positive pole and the negative pole of the power supply 32. An output of the first branch drives the gate g of the IGBT $Q_1$. A second branch includes a series connection of two semiconductor switches $Q_4$ and $Q_5$ between the positive pole and the negative pole. An output of the second branch drives the auxiliary emitter terminal $e_{aux}$ of the IGBT $Q_1$. By setting switches $Q_2$ and $Q_5$ to a conductive state, a positive gate-emitter voltage $v_{ge}$ is generated. Alternatively, by setting switches $Q_3$ and $Q_4$ to a conductive state, a negative gate-emitter voltage $v_{ge}$ is generated.

In FIG. 3, the switches $Q_2$ and to $Q_5$ are controlled by using complementary control signals $s_1$ and $\overline{s_1}$. The switches $Q_3$ and to $Q_4$ are controlled by using complementary control signals $s_2$ and $\overline{s_2}$. The control circuitry (including isolator/s) that generates these signals may be tied to the negative pole of the voltage supply 32 which acts a local ground potential. The single-ended power supply 32 enables use of a single isolator unit for the control of the switches $Q_2$ to $Q_5$.

The local ground potential may be used as a reference potential. Thus, the driver means 31 generates a first gate-emitter voltage level (acting as the first control voltage level) and a second gate-emitter voltage level (acting as the second control voltage level) that generate different gate voltages with respect to the local ground. The local ground potential is shown as a triangular ground symbol in FIG. 3.

In FIG. 3, the voltage over the inductance is measured between the auxiliary emitter terminal $e_{aux}$ (e.g., the first end of the inductance $L_1$) and the main emitter terminal $e_{main}$ (e.g., the second end of the inductance $L_1$).

A first resistor averager 34 acts as the first measuring means that generates a first measurement voltage $v_{m,1}$ on the basis of a voltage at the auxiliary emitter terminal $e_{aux}$.

The first measurement voltage $v_{m,1}$ is generated on the basis of the auxiliary emitter terminal voltage with respect to the local ground potential. The first resistor averager 34 may include a first resistor $R_1$, a second resistor $R_2$, and a third resistor $R_3$. The first resistor $R_1$ connects the auxiliary emitter terminal $e_{aux}$ to a first measurement point. The second resistor $R_2$ connects a local ground potential to the first measurement point. The local ground potential is connected to the negative pole of a power supply for supplying the gate-emitter voltage $v_{ge}$. The third resistor $R_3$ connects an output of a voltage reference $v_{pp}$ to the first measurement point. The first measurement voltage $v_{m,1}$ can be measured from the first measurement point. Together, the resistors $R_1$ to $R_3$ form a first gain and a first offset of the first resistor averager 34.

A second resistor averager 35 acts as the second measuring means that generate a second measurement voltage $v_{m,2}$ with respect to the reference potential on the basis of a voltage at the main emitter terminal $e_{main}$.

The second measurement voltage $v_{m,2}$ is generated on the basis of the main emitter terminal voltage with respect to the local ground potential. The second resistor averager 35 may include a fourth resistor $R_4$, fifth resistor $R_5$, and sixth resistor $R_6$. The fourth resistor $R_4$ connects the main emitter terminal $e_{main}$ to a second measurement point; the fifth resistor $R_5$ connects the local ground potential to the second measurement point; and the sixth $R_6$ resistor connects the output of the voltage reference to the second measurement point. The second measurement voltage $v_{m,2}$ can be measured from the second measurement point. Together, the resistors $R_4$ to $R_6$ form a second gain and a second offset of the second resistor average 35. The second resistor averager 35 may also include a capacitor $C_1$ in parallel with the fifth resistor thereby forming a low-pass filter that filters out spikes and oscillations in the measurement of the main emitter terminal voltage.

The arrangement in FIG. 2 further includes a comparator 36 that compares the first measurement voltage $v_{m,1}$ with the second measurement voltage $v_{m,2}$. The output of the comparator 36 output may be tied to the local ground potential.

The resistances of the resistors $R_1$ to $R_3$ and $R_4$ to $R_6$ can be selected such that the arrangement is able to detect four types of instances with one comparator: the level of the gate-emitter voltage $v_{ge}$ changing to turn the IGBT $Q_1$ on, the level of the gate-emitter voltage $v_{ge}$ changing to turn the IGBT $Q_1$ off, the time (start and end) the rate of change of the emitter current exceeding a set limit during turn-on, and the time (start and end) the rate of change of the emitter current being below a (negative) limit for the rate of change during turn-off. The resistances of the resistors $R_1$ to $R_3$ and $R_4$ to $R_6$ may be selected such that the second gain is lower than the first gain and the second offset is higher than the first offset, for example.

The resistances of the resistors $R_1$ to $R_3$ and $R_4$ to $R_6$ are configured such that as magnitude of the rate of change increases, the voltage over the inductor $L_1$ decreases during both turn-on and turn-off events.

If the rate of change reaches a first threshold for the rate of change during a turn-on event, the voltage difference between the first measurement voltage $v_{m,1}$ and the second measurement voltage $v_{m,2}$ reduces to zero. If the rate of change increases above the first threshold, the voltage difference changes its sign and the comparator changes its state.

Accordingly, if the rate of change decreases below a second set threshold (having the opposite sign) during a turn-off event, the voltage difference changes its sign and the comparator changes its state. The resistances of the resistors $R_1$ to $R_3$ and $R_4$ to $R_6$ can be chosen such that the first threshold level and the second threshold levels have different magnitudes.

In addition, the arrangement of FIG. 3 also indicates the instants of turning on and off the gate-emitter voltage $v_{ge}$. At the instant of the gate-emitter voltage $v_{ge}$ change, the emitter current does not yet change. Thus, during a turn-on event, the first level of the gate-emitter voltage $v_{ge}$ induces a first voltage difference level between the first measurement voltage $v_{m,1}$ and the second measurement voltage $v_{m,2}$ that sets the comparator to a first state. Accordingly, the second gate-emitter voltage $v_{ge}$ level induces a second voltage difference level between the first measurement voltage $v_{m,1}$ and the second measurement voltage $v_{m,2}$ that sets the comparator to a second state.

In FIG. 3, the signals controlling the switches to of the H-bridge 33 and the comparator output are tied to the same potential, the local ground. Thus, a single multichannel isolating unit may be used for the comparator output and for controlling of the H-bridge 33.

Since instants of control terminal turn-on and turn-off events are being detected, a round trip delay may be measured and a delay variation of the isolation component may be minimized. For example, an FPGA may be used for controlling switching of the H-bridge 33 via two isolator channels (one for generating complementary control signals $s_1$ and $\overline{s_1}$ for switches $Q_2$ and $Q_5$, and the other for generating complementary control signals $s_2$ and $\overline{s_2}$ for switches $Q_3$ and $Q_4$, for example). When the gate-emitter voltage $v_{ge}$ changes in response to the FPGA's control, the comparator output changes its state, and an indication is sent back to the FPGA through an isolator channel. The FPGA may calculate the round trip delay by measuring the time difference between the instant the control signal(s) left and the instant the turn-on or turn-off feedback arrived.

Since the indications on turn-on events and rates of change use the same comparator and feedback isolator channel in FIG. 3, they are delayed by the same amount of time. Thus, the effect of delay skew of comparator and isolator components may be minimized by evaluating the time difference from gate turn and rate-of-change pulse.

In FIG. 3, the driver means 31 are shown in a simplified form. In some implementations according to the present disclosure, the driver means may also be adapted to perform a soft (slow) turn-off of the IGBT during an over-current situation in the conductive state. If the IGBT in an over-current state is turned off quickly, a voltage spike may be induced. The voltage spike may exceed a maximum collector-emitter voltage set to the IGBT itself and/or to other IGBTs in the implementation. Therefore, it may be desirable to be able to detect the over-current state and turn off the IGBT slowly.

Figure 4:
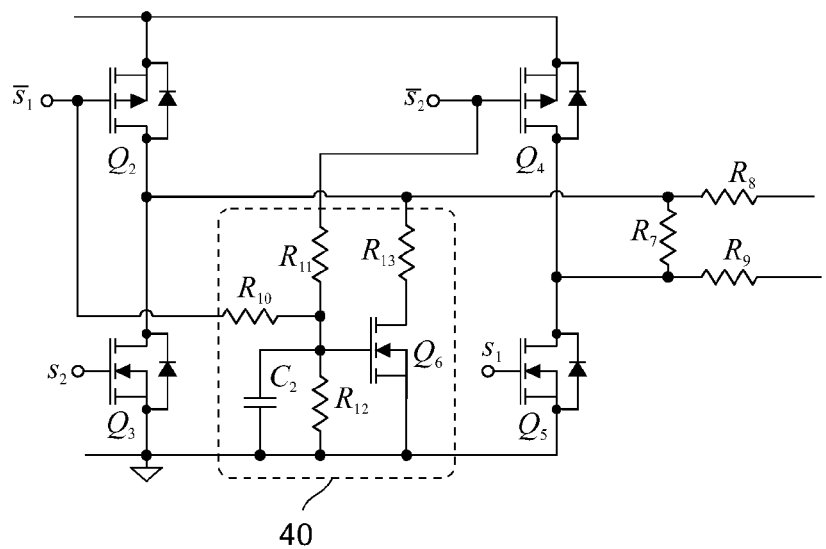
FIG. 4 shows a soft turn-off circuitry that may be used together with an H-bridge driving a control voltage of a power semiconductor switch according to an exemplary embodiment of the present disclosure.

FIG. 4 shows a soft turn-off circuitry that may be used together with an H-bridge driving a control voltage of a power semiconductor switch according to an exemplary embodiment of the present disclosure.

The soft-turn-off circuitry 40 in FIG. 4 includes a series connection of a resistor $R_{13}$ and a soft-turn-off semiconductor switch $Q_6$ between the output of the first branch of the H-bridge and the local ground that acts as the reference potential.

The soft-turn-off circuitry 40 may further includes means for controlling the soft-turn-off semiconductor switch $Q_6$ on the basis of control signals controlling the semiconductor switches $Q_2$ to $Q_5$ in the first and second branch of the H-bridge. The means may be configured to set the soft turn-off semiconductor switch $Q_6$ into the conductive state when the control signals set the semiconductor switches $Q_2$ to $Q_5$ into the non-conductive state.

For example, the soft turn-off circuitry 40 may include a resistor averager that acts as the means for controlling the soft-turn-off switch $Q_6$, as in FIG. 4. An output of the averager may be connected to control the gate of the switch $Q_6$.

The resistor averager in FIG. 4 includes resistors $R_{10}$, $R_{11}$, and $R_{12}$. The resistors $R_{10}$ and $R_{11}$ connect control signals $\overline{s_1}$ and $\overline{s_2}$ to the output of the resistor averager while the resistor $R_{12}$ connects the local ground to the output. The resistances of the resistors $R_{10}$, $R_{11}$, and $R_{12}$ may be selected such that when both of the inverted control signals $\overline{s_1}$ and $\overline{s_2}$ are set high, e.g., when the switches $Q_2$ to $Q_5$ are all set to non-conductive state, the resistors $R_{10}$ and $R_{11}$ are able to pull the switch into conductive state.

The soft turn-off circuitry 40 in FIG. 4 further includes a diode between the local ground and the output of the second branch of the H-bridge. In FIG. 4, all switches $Q_2$ to $Q_5$ have antiparallel diodes that may be body diodes of the switches, for example. Alternatively, a separate anti-parallel diode may be coupled to switch $Q_5$.

When both of the inverted control signals $\overline{s_1}$ and $\overline{s_2}$ are set high, and the switch $Q_6$ is set into the conductive state, a current path through the resistor $R_{13}$, the switch $Q_6$, and an anti-parallel diode of the switch $Q_5$ is formed. A current limited by the resistor $R_{13}$ causes the gate-emitter voltage $v_{ge}$ to decrease in a controlled manner.

Conductive state overcurrent may also be detected by using a known de-saturation voltage measurement, for example. During the conductive state, if a short circuit occurs, the voltage over the switch, e.g. the collector-emitter voltage $v_{ce}$ rises above a set threshold, and over-current is detected. The de-saturation voltage detection may be tied to the same potential as the above-described switching event/rate-of-change monitoring signal. Thus, the same isolating unit can be used.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An arrangement for a power semiconductor switch in which a first current between a first electrode and a second electrode is configured to be controlled on the basis of a control voltage between a third electrode and the first electrode, the arrangement comprising:
    an inductance connected in series with the power semiconductor switch, wherein a first end of the inductance is connected to the first electrode;
    first measuring means for generating a first measurement voltage on the basis of a voltage of the first end of the inductance with respect to a reference potential, wherein the first measuring means has a first gain and a first offset;
    second measuring means for generating a second measurement voltage on the basis of a voltage of a second end of the inductance with respect to the reference potential, wherein the second measuring means has a second gain that differs from the first gain and a second offset that differs from the first offset;
    a comparator for comparing the first measurement voltage with the second measurement voltage; and
    driver means for generating the control voltage, the driver means being configured to generate a first control voltage level and a second voltage level of the control voltage, wherein the driver means are coupled to the reference potential in such a manner that, during use, the first and second voltage levels generate different first electrode voltages with respect to the reference potential.

2. The arrangement as claimed in claim 1, wherein the second gain is lower than the first gain and the second offset is higher than the first offset.

3. The arrangement as claimed in claim 1, wherein the first gain, the second gain, the first offset, and the second offset are selected such that, in operation:
    a change in the rate of change of the first current flowing through the inductance induces a change in a voltage difference between the first measurement voltage and the second measurement voltage; and
    when the magnitude of the rate of change exceeds a set limit, the voltage difference changes polarity and the comparator changes states.

4. The arrangement as claimed in claim 3, wherein the first gain, the second gain, the first offset, and the second offset are selected such that, in operation:
    when the rate of change increases above a first limit during a turn-on event, the voltage difference reduces to zero and the comparator changes states; and
    when the rate of change decreases below a second limit during a turn-off event, the voltage difference reduces to zero and the comparator changes states.

5. The arrangement as claimed in claim 1, wherein the first gain, the second gain, the first offset and the second offset are selected such that, during the use of the arrangement, when the voltage over the inductance is zero:
    the first control voltage level induces a first voltage difference level between first measurement voltage and the second measurement voltage, the first voltage difference level setting the comparator to a first state; and
    the second control voltage level induces a second voltage difference level between first voltage and the second voltage, the second voltage difference level setting the comparator to a second state.

6. The arrangement as claimed in claim 1, wherein the power semiconductor switch is a unit in which:
the first electrode includes a main terminal and an auxiliary terminal, the control voltage being supplied between the third electrode and the auxiliary terminal of the first electrode; and
the inductance is formed by a bonding wire in the unit, the voltage over the inductance being measured between the auxiliary terminal and the main terminal.

7. The arrangement as claimed in claim 1,
wherein the first measuring means are a first resistor averager that comprises:
a first resistor connecting the first end of the inductance to a first measurement point;
a second resistor connecting the reference potential to the first measurement point, wherein the reference potential is connected to a negative pole of a power supply for supplying the control voltage; and
a third resistor connecting an output of a voltage reference to the first measurement point, and
wherein the second measuring means are a second resistor average that comprises:
a fourth resistor connecting the second end of the inductance to a second measurement point;
a fifth resistor connecting the reference potential to the second measurement point; and
a sixth resistor connecting the output of the voltage reference to the second measurement point.

8. The arrangement as claimed in claim 1, wherein the driver means comprises:
a power supply for supplying the control voltage between the third electrode and the first electrode, and
switching means for inverting the polarity of the control voltage supplied.

9. The arrangement as claimed in claim 8, wherein the switching means are an H-bridge comprising:
a first branch having a series connection of two semiconductor switches between a positive pole and a negative pole of the power supply, wherein an output of the first branch is configured to drive the third electrode; and
a second branch having a series connection of two semiconductor switches between the positive pole and the negative pole, wherein an output of the second branch is configured to drive the first electrode.

10. The arrangement as claimed in claim 9, wherein the switching means comprise a soft turn-of circuitry comprising:
a diode between the reference potential and the output of the second branch;
a series connection of a resistor and a soft turn-off semiconductor switch between the reference potential and the output of the first branch;
means for controlling the soft turn-off semiconductor switch on the basis of control signals controlling the semiconductor switches in the first and second branches, the means being configured to set the soft turn-off semiconductor switch into conductive state when the control signals set the semiconductor switches in the first and second branch into non-conductive state.

11. A method for a power semiconductor switch in which a first current between a first electrode and a second electrode is controlled on the basis of a control voltage between a third electrode and the first electrode, the power semiconductor being connected in series with an inductance, and a first end of the inductance being connected to the first electrode, the method comprising:
controlling the power semiconductor switch by generating a first control voltage level and a second voltage level of the control voltage in a manner that the first and second voltage levels generate different first electrode voltages with respect to a reference potential;
generating a first measurement voltage on the basis of a first end voltage of the inductance with respect to the reference potential by using measuring means having a first gain and a first offset;
generating a second measurement voltage on the basis of a second voltage of the inductance with respect to the reference potential by using measuring means having second gain that differs from the first gain and a second offset that differs from the first offset;
comparing the first measurement voltage with the second measurement voltage; and
generating a feedback signal on the basis of the comparison.

12. The method as claimed in claim 11, wherein the second gain is lower than the first gain and the second offset is higher than the first offset.

13. The method as claimed in claim 11, wherein the first gain, the second gain, the first offset, and the second offset are selected such that, during a turn-on event and a turn-off event:
a change in the rate of change of the first current flowing through the inductance induces a change in a voltage difference between first measurement voltage and the second measurement voltage, and
when the magnitude of the rate of change exceeds a limit, the voltage difference changes polarity and the comparator changes states.

14. The method as claimed in claim 11, wherein the first gain, the second gain, the first offset and the second offset are selected such that, when the voltage over the inductance is zero:
the first control voltage level induces a first voltage difference level between first measurement voltage and the second measurement voltage, the first voltage difference level setting the comparator to a first state; and
the second control voltage level induces a second voltage difference level between first voltage and the second voltage, the second voltage difference level setting the comparator to a second state.

* * * * *